(12) United States Patent
Ishikawa et al.

(10) Patent No.: US 8,471,622 B2
(45) Date of Patent: Jun. 25, 2013

(54) DRIVE CIRCUIT OF SEMICONDUCTOR DEVICE

(75) Inventors: Katsumi Ishikawa, Hitachinaka (JP); Kazutoshi Ogawa, Hitachi (JP); Masahiro Nagasu, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/760,742

(22) Filed: Apr. 15, 2010

(65) Prior Publication Data
US 2010/0265746 A1 Oct. 21, 2010

(30) Foreign Application Priority Data
Apr. 17, 2009 (JP) ................. 2009-100849

(51) Int. Cl.
H03K 17/60 (2006.01)
(52) U.S. Cl.
USPC .................. 327/434; 327/108; 327/112
(58) Field of Classification Search
USPC .............. 327/108, 374, 376, 377, 419, 427, 327/434–437
See application file for complete search history.

(56) References Cited

U.S. PATENT DOCUMENTS

| | | | |
|---|---|---|---|
| 5,949,273 A | 9/1999 | Mourick et al. | |
| 5,977,814 A * | 11/1999 | Ishii | ............ 327/434 |
| 6,680,630 B1 | 1/2004 | Hiyama | |
| 6,768,146 B2 | 7/2004 | Yoshida | |
| 2004/0042139 A1 | 3/2004 | Belverde et al. | |
| 2009/0102541 A1* | 4/2009 | Lopez et al. | ............ 327/434 |

FOREIGN PATENT DOCUMENTS

| | | |
|---|---|---|
| EP | 0427143 A2 | 5/1991 |
| EP | 0588094 A1 | 3/1994 |
| EP | 1808954 A2 | 7/2007 |
| JP | 10-080132 A | 3/1998 |
| JP | 10-127045 | 5/1998 |
| JP | 2000-228868 | 8/2000 |
| JP | 2003-229566 | 8/2003 |

OTHER PUBLICATIONS

Chokhawala, R. et al; "Gate Drive Considerations for IGBT Modules," International Rectifier Corporation, Jan. 1992, pp. 1186-1195; USA.

* cited by examiner

Primary Examiner — Lincoln Donovan
Assistant Examiner — Diana J Cheng
(74) Attorney, Agent, or Firm — Antonelli, Terry, Stout & Kraus, LLP.

(57) ABSTRACT

The invention provides a switching circuit of a power semiconductor device having connected in parallel SiC diodes with a small recovery current, capable of significantly reducing turn-on loss and recovery loss without increasing the noise in the MHz band, and contributing to reducing the loss and noise of inverters. The present invention provides a switching circuit and an inverter circuit of a power semiconductor device comprising a module combining Si-IGBT and SiC diodes, wherein an on-gate resistance is set smaller than an off-gate resistance.

4 Claims, 11 Drawing Sheets

DRIVE CIRCUIT OF SEMICONDUCTOR DEVICE

The present application is based on and claims priority of Japanese patent application No. 2009-100849 filed on Apr. 17, 2009, the entire contents of which are hereby incorporated by reference.

BACKGROUND OF THE INVENTION

1. Field of the Invention

The present invention relates to a gate drive circuit of a power semiconductor module, comprising a power semiconductor switching device having connected thereto in parallel a freewheeling diode having a small reverse recovery current such as a Schottky barrier diode of a wide bandgap semiconductor such as SiC and GaN or a PiN diode of a wide bandgap semiconductor, and an inverter circuit comprising the same.

2. Description of the Related Art

FIG. 5 shows a circuit diagram of a common inverter using IGBTs (insulated gate bipolar transistors). The inverter is composed of six IGBTs and diodes, and power is supplied from a main circuit power supply to a load motor by alternately switching the IGBTs on the upper arm and the lower arm. There are demands to reduce conduction loss and switching loss caused by the IGBTs and diodes in the inverter device. In order to reduce such losses, it is necessary to improve the structure of the IGBT so as to reduce the on-voltage, or to improve the drive circuit of the IGBT to enable the IGBT to be driven at high speed. PiN diodes formed of Si are generally used as the diodes.

FIG. 6 shows a circuit diagram of the IGBT corresponding to a single phase, and a recovery waveform of an upper diode and a turn-on waveform of a lower IGBT when the lower IGBT is turned on. By driving the IGBT at high speed (solid line waveform) which is faster than normal drive speed (dotted line waveform), the di/dt of the IGBT during turn-on is increased, and both the turn-on loss and the recovery loss can be reduced. However, the di/dt of the reverse recovery of the PiN diode is also increased, and the current change (reverse recovery di/dt) during attenuation of the reverse recovery current of the PiN diode is multiplied with the main circuit inductance L to create a commutation surge (ΔVp=L×reverse recovery di/dt), wherein when the sum (E+ΔVp) of the power supply voltage (E) and the surge voltage (ΔVp) exceeds the withstand voltage of the power semiconductor switching device, the power semiconductor device may be damaged. Therefore, arts related to reducing the inductance of the main circuit and arts related to varying the turn-on di/dt have been proposed.

For example, Japanese patent No. 3161589 (patent document 1) discloses an art of detecting the recovery current of a freewheeling diode, and switching the turn-on di/dt in two steps to thereby reduce both the turn-on loss and the surge voltage.

Further, Japanese patent No. 3941309 (patent document 2) discloses an art of controlling the turn-on gate drive speed in three steps (high speed, low speed, and high speed) so as to solve the problem of high dv/dt generated when the turn-on di/dt is set to high speed, which causes a noise in the range of over a few MHz and causes erroneous operation of peripheral devices, and to realize both noise reduction in the high frequency range and loss reduction.

As described above, according to the prior art IGBT inverter and the inventions disclosed in patent documents 1 and 2, attempts were made to reduce both the turn-on loss and the surge voltage or to reduce both the noise in the high frequency range and the loss by varying the gate charge speed. However, there were drawbacks according to the Si-PiN diode in which the recovery current became high when a large amount of current was conducted, and a large surge voltage was generated when a small current was conducted for a short period of time.

SUMMARY OF THE INVENTION

In order to solve such problems of the prior art, the present invention provides a drive circuit of a semiconductor device utilizing a Schottky barrier diode such as silicon carbide (SiC) and gallium nitride (GaN), which is a new wide bandgap semiconductor to be used instead of Si, to thereby drive the gate at high speed.

The present invention provides a gate drive circuit of a power semiconductor switching device comprising a power semiconductor switching device, and a freewheeling diode having a small reverse recovery current such as a Schottky barrier diode of a wide bandgap semiconductor such as SiC and GaN or a PiN diode of a wide bandgap semiconductor, wherein an on-gate resistance of the power semiconductor switching device is set smaller than an off-gate resistance thereof.

The gate drive circuit of the present invention further characterizes in that when the line inductance of the power semiconductor device and the gate drive circuit is denoted by $L_g$, a buried resistance of the power semiconductor device is denoted by $R_{gin}$, an input capacitance of the power semiconductor device is denoted by $C_{ies}$ (and an on-gate resistance of the power semiconductor switching device is denoted by $R_{gon}$, the gate resistance satisfies the following condition;

$$R_{gon} > 2\sqrt{\frac{L_g}{C_{ies}}} - R_{gin}. \quad \text{[Expression]}$$

The present gate drive circuit also characterizes in that a capacitor is provided in parallel with the on-gate resistance of the power semiconductor switching device as a means for realizing high-speed driving.

The present invention further provides an inverter circuit comprising a power semiconductor switching device, a freewheeling diode having a small reverse recovery current such as a Schottky barrier diode of a wide bandgap semiconductor such as SiC and GaN or a PiN diode of a wide bandgap semiconductor, a power semiconductor module equipped with the power switching device and the freewheeling diode, and a gate drive circuit of the power semiconductor switching device, wherein a first high-voltage side terminal of the power semiconductor switching device of the power semiconductor module and a second high-voltage side terminal of the Schottky barrier diode of the wide bandgap semiconductor such as SiC and GaN are disposed independently, and an inductance is disposed between the first high-voltage side terminal and the second high-voltage side terminal.

According to the present invention, the gate drive speed of the power semiconductor module connected in parallel to a freewheeling diode having a small reverse recovery current such as a Schottky barrier diode of a wide bandgap semiconductor such as SiC or a PiN diode of a wide bandgap semiconductor is increased, so that the switching loss of the power semiconductor device is reduced, and as a result, the loss and the noise of the inverter can be reduced.

DETAILED DESCRIPTION OF THE PREFERRED EMBODIMENTS

Now, the preferred embodiments for carrying out the present invention will be described with reference to the drawings.

Embodiment 1

Figure 1:
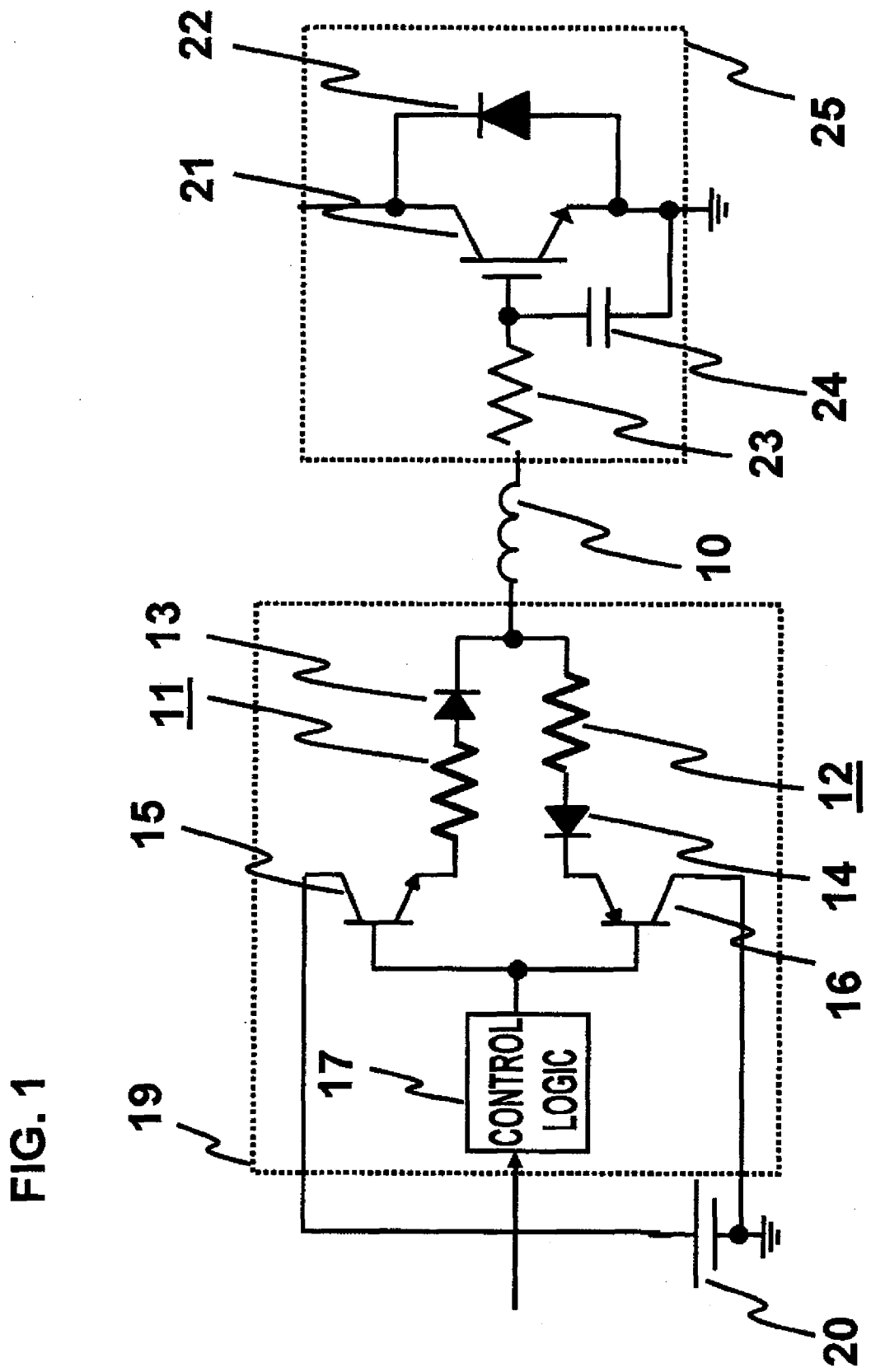
FIG. 1 is a block diagram of a drive circuit of a power semiconductor device according to a first embodiment of the present invention.

FIG. 1 is a block diagram of a drive circuit of a power semiconductor device according to a, first preferred embodiment of the present invention. A main circuit of an inverter is composed of Si-IGBT 21 and SiC-SBD 22. Si-IGBT has a buried resistance ($R_{gin}$) 23 and an IGBT input capacitance ($C_{ies}$) 24 built into the IGBT. The Si-IGBT 21 and 22 of the main circuit are driven via a drive circuit 19 according to the present invention and a drive circuit power supply 20. According to the present drive circuit, an on-side gate resistance 11 is set to be smaller than an off-side gate resistance 12.

The SiC-SBD 22 has a breakdown voltage strength as high as approximately 10 times that of Si, and therefore, a drift layer for ensuring pressure resistance can be reduced to approximately 1/10, so that the on-voltage of the power device can be reduced. Thus, SiC and other wide bandgap semiconductor devices can use unipolar devices even in high pressure resistance areas where Si semiconductor devices can only use bipolar devices.

Figure 2:
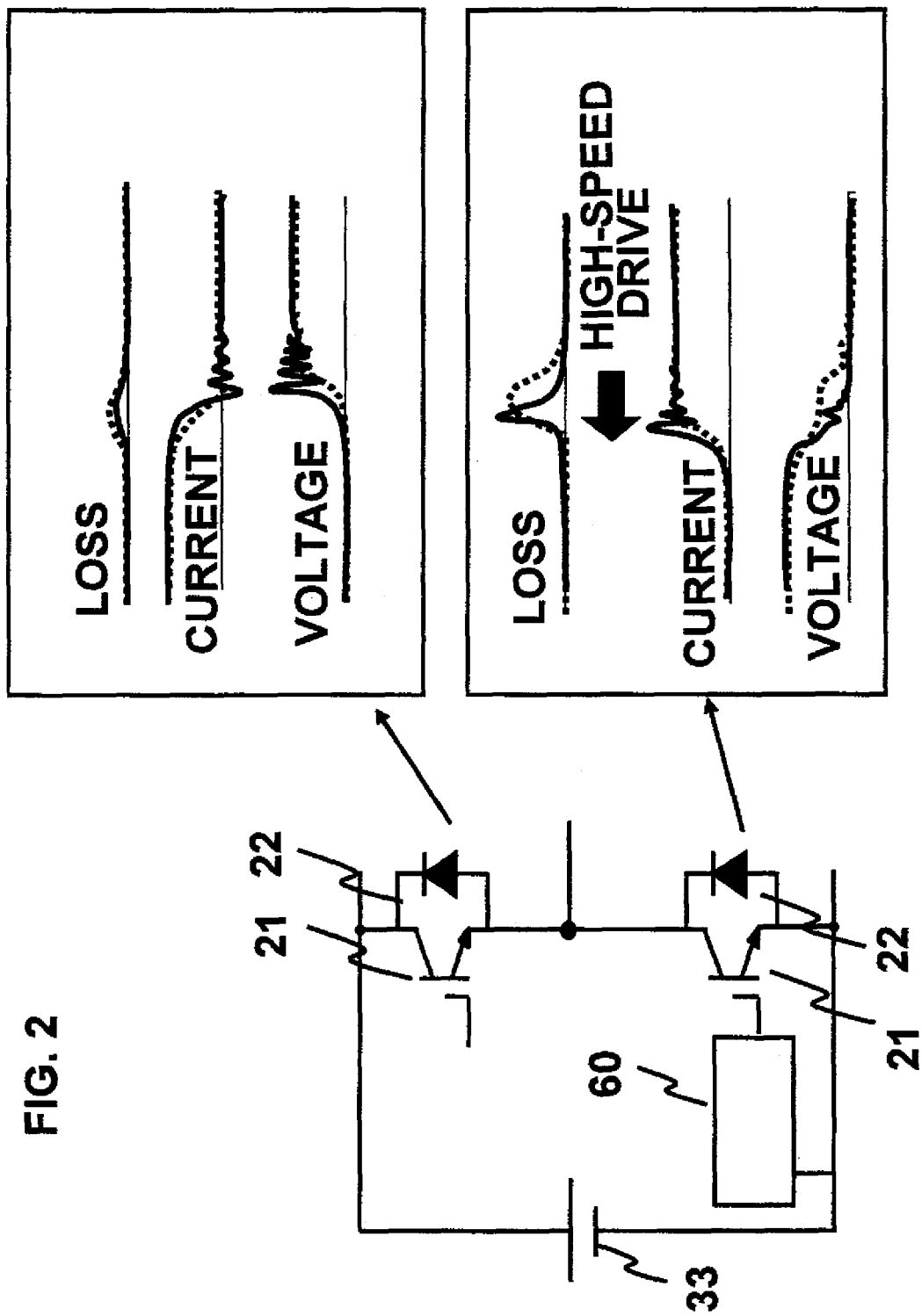
FIG. 2 shows waveforms of voltage, current and loss when the first embodiment according to the present invention is applied.

FIG. 2 shows an IGBT circuit diagram corresponding to a single phase, and a recovery waveform of an upper diode and a turn-on waveform of a lower IGBT when the lower IGBT is turned on. The dotted waveforms illustrate the case where the turn-on speed of the IGBT is not increased.

Figure 6:
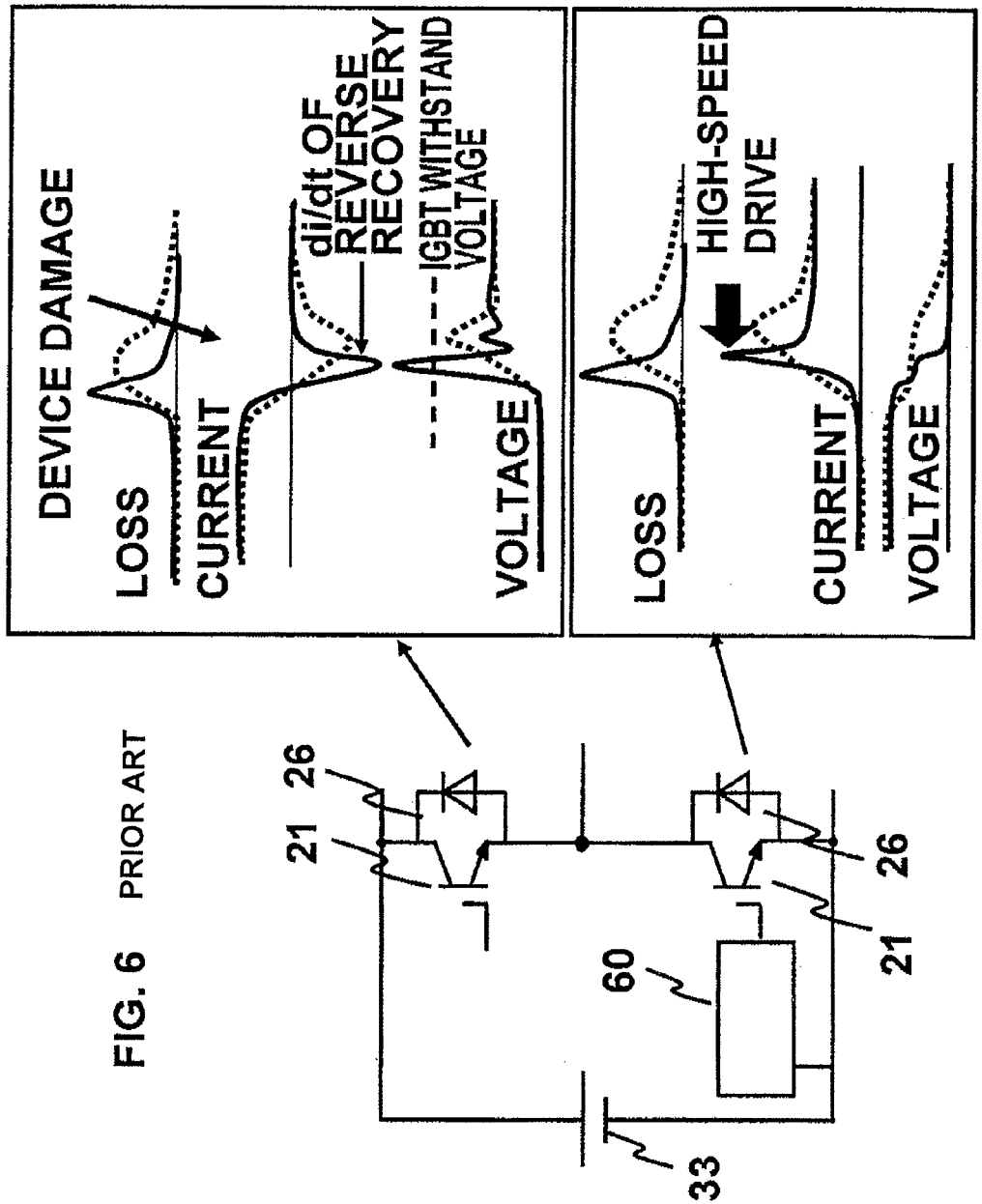
FIG. 6 shows waveforms of voltage, current and loss using a power module embedded in a PiN diode according to the prior art.

In comparison with FIG. 6, the present example has a recovery loss reduced to 1/10, and a turn-on loss reduced to 1/2. When the Si-PiN diode of FIG. 6 is adopted, speed-up causes di/dt of the reverse recovery of the PiN diode to be increased, which is multiplied with the main circuit inductance L to create a commutation surge ($\Delta Vp = L \times$ reverse recovery di/dt), and when the sum ($E+\Delta Vp$) of the power supply voltage (E) and the surge voltage ($\Delta Vp$) exceeds the withstand voltage of the power semiconductor switching device, the power semiconductor device may be damaged. On the other hand, when the SiC-SBD 22 is adopted, as shown by the solid line waveform, no reverse recovery current is generated by performing speed-up and no large surge voltage is caused in the recovery voltage, so that increase of speed becomes possible.

Figure 3:
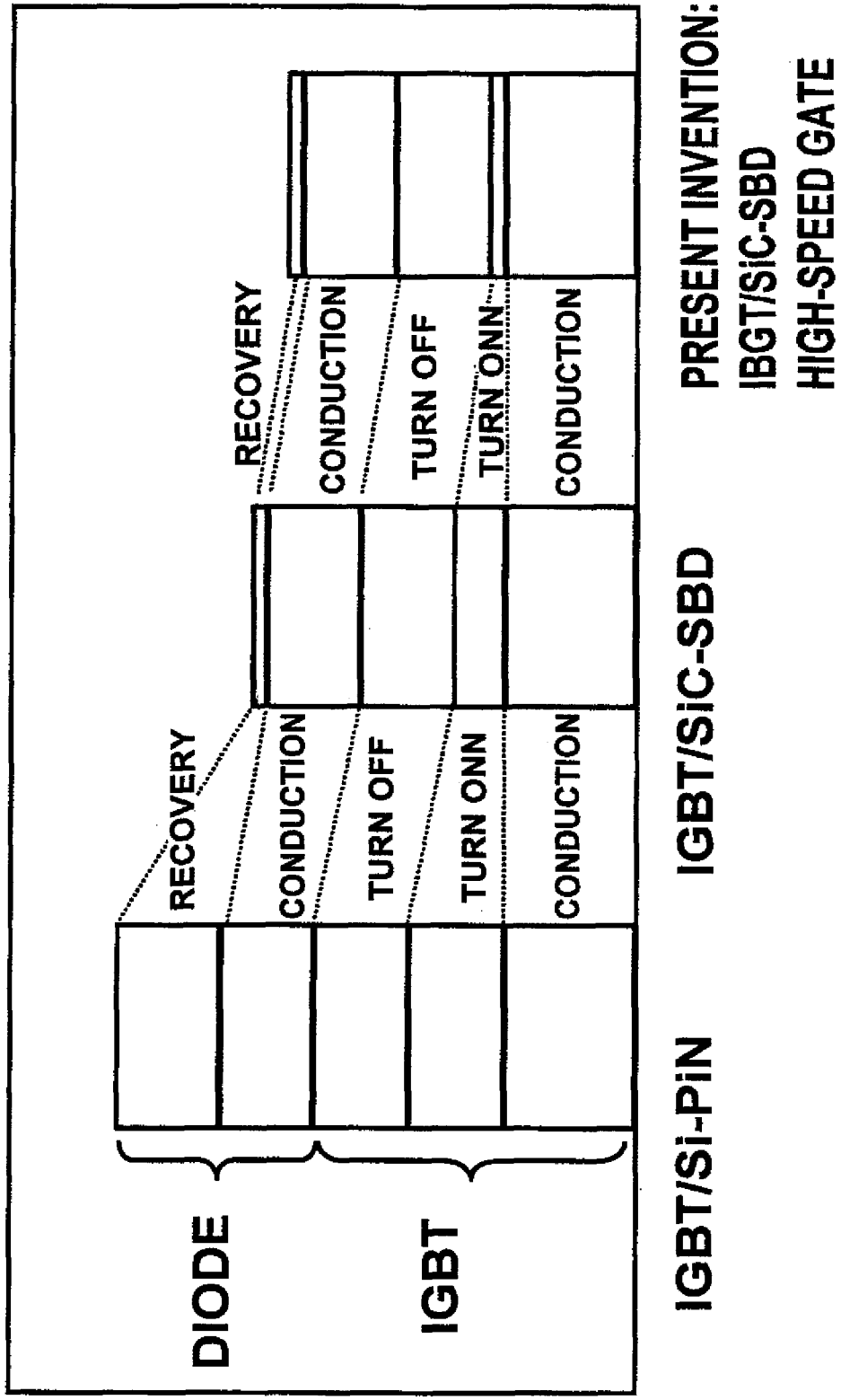
FIG. 3 shows the effect of reducing loss when the first embodiment according to the present invention is applied.

FIG. 3 shows the effect of reducing loss when the device is operated as an inverter. By replacing the Si-PiN diode with the SiC-SBD, the recovery loss can be reduced to 1/10 and the turn-on loss can be reduced to 1/2. Further, by driving the IGBT at high-speed, the turn-on loss can be further reduced from 1/2 to 1/5.

Figure 4:
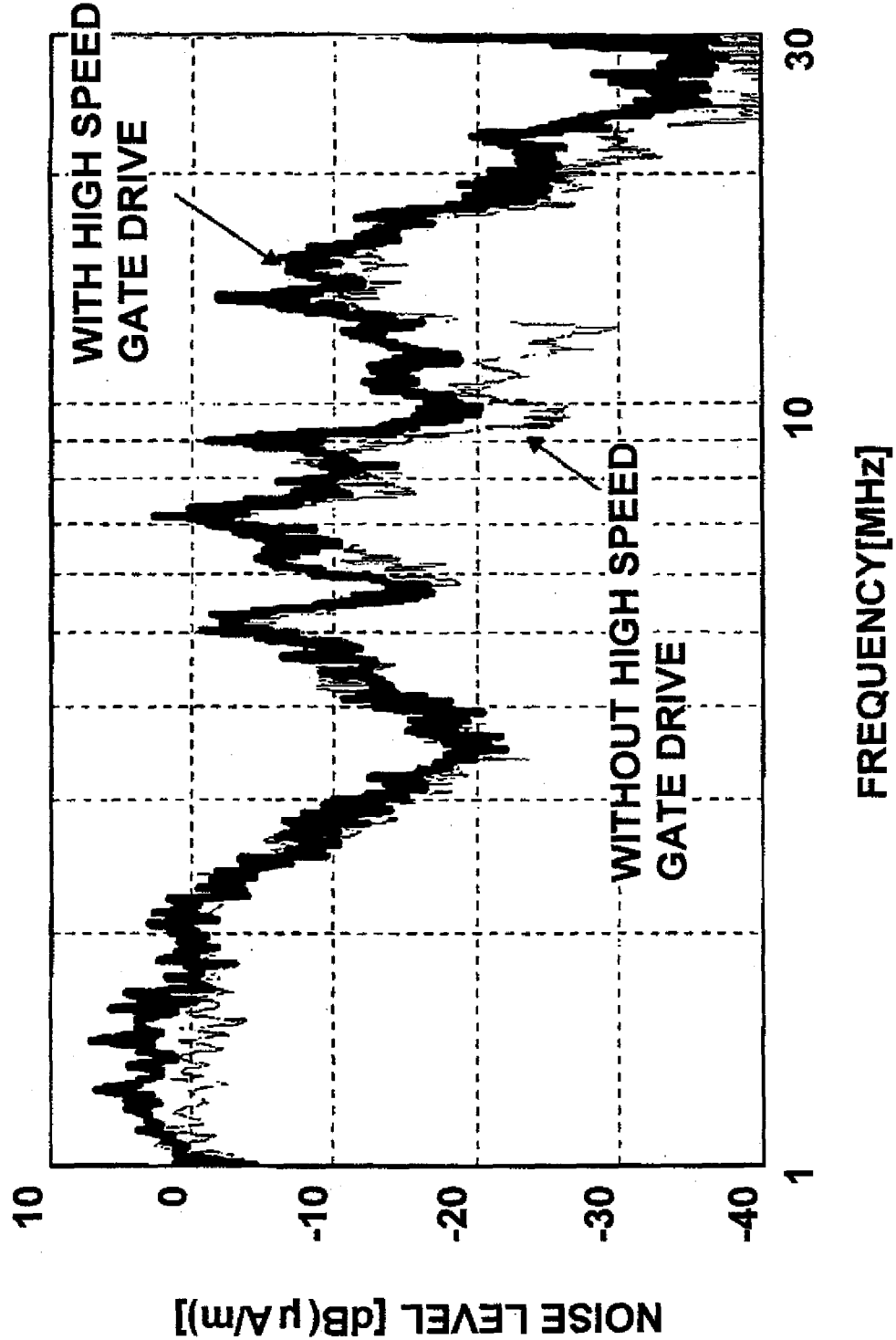
FIG. 4 shows the result of evaluation of noise in the MHz band when the first embodiment according to the present invention is applied.
Figure 5:
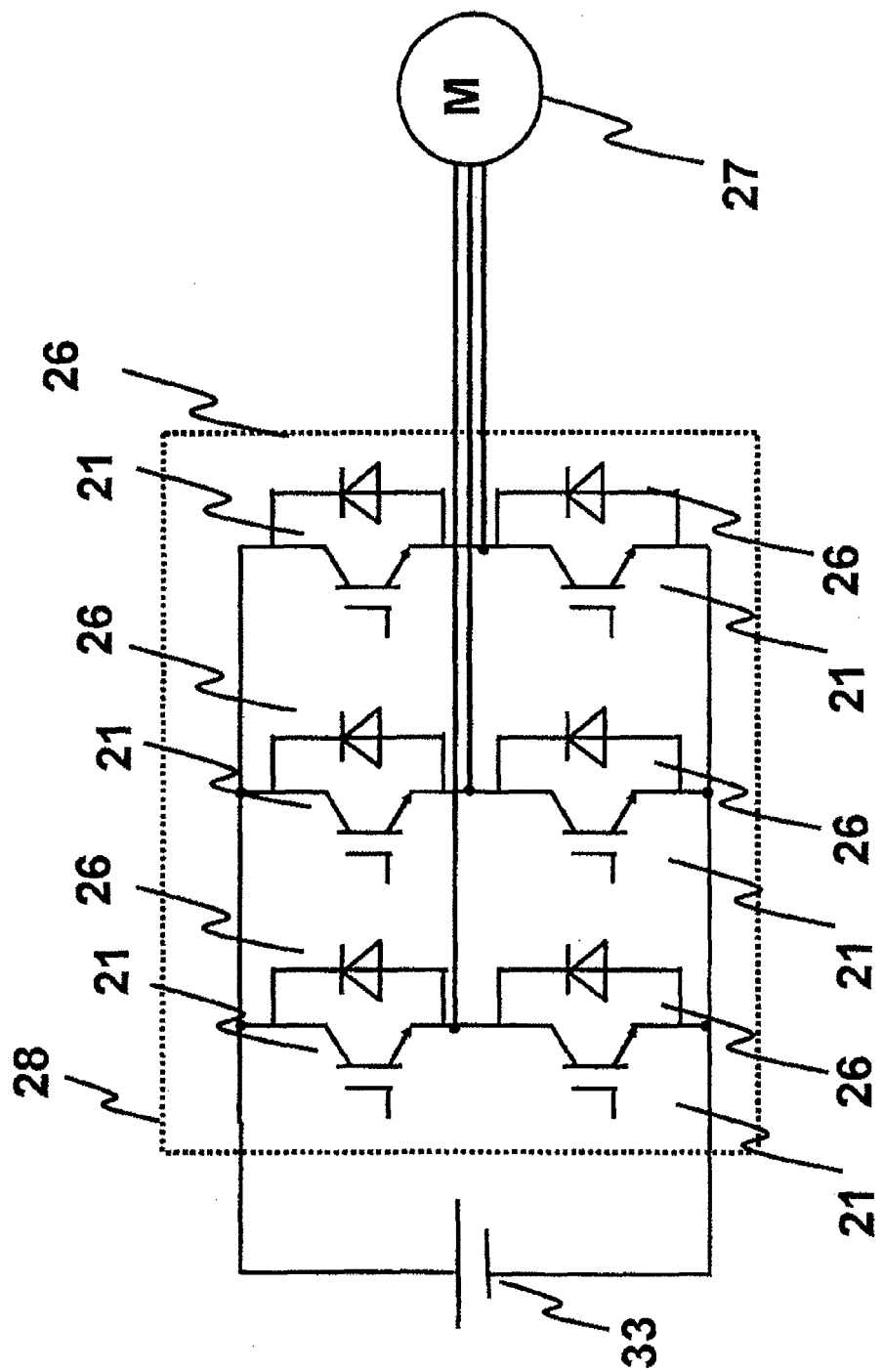
FIG. 5 is an inverter circuit diagram according to the prior art.

FIG. 4 shows the result of actual measurement of noise in the MHz-band when a 200-kW class inverter is driven using six modules combining Si-IGBT and SiC-SBD. There was no noise increase in the MHz band even when speed-up was performed. Very little ringing noise accompanying the high speed drive was transmitted to the exterior since the recovery current was substantially zero. Therefore, by adopting the SiC-SBD, reducing the on-gate resistance and performing high-speed driving, the turn-on loss could be reduced without increasing the MHz-band noise.

Further, the value of the on-gate resistance 11 should preferably be selected to satisfy a condition in which the gate circuit does not resonate. According to this condition, the circuit is an LRC resonant circuit in which an on-gate resistance ($R_{g11}$) 11 is connected in series with a gate line inductance ($L_g$) 10, an IGBT buried resistance ($R_{gin}$) 23 and an IGBT input capacitance ($C_{ies}$) 24, wherein the circuit must satisfy a condition in which resonance does not occur. With respect to expression 1

[Expression 1]

$$L_g \cdot \frac{di}{dt} + (R_{g11} + R_{gin}) \cdot i + \frac{1}{C_{ies}} \int i \cdot dt = E \quad (1)$$

having a following characteristic value

[Expression 2]

$$s = \frac{R_{g11} + R_{gin}}{2L_g} \pm \sqrt{\frac{(R_{g11} + R_{gin})^2}{4L_g^2} - \frac{1}{L_g \cdot C_{ies}}} \quad (2)$$

the condition for realizing overdamping in which gate vibration does not occur is

[Expression 3]

$$R_{g11} > 2\sqrt{\frac{L_g}{C_{ies}}} - R_{gin} \quad (3)$$

therefore, the on-gate resistance must satisfy expression (3).

In the present embodiment, the Si-IGBT is used as the switching device, but the switching device can be a MOSFET in the case of Si and can be a MOSFET, a junction FET or a bipolar transistor in the case of SiC. Moreover, the present embodiment adopts an SiC-SBD as the paralelly-connected diode, but similar effects can be achieved by adopting an SBD of a wide bandgap semiconductor such as GaN and diamond, a PiN diode, or a diode having an MPS (merged Schottky barrier) structure where an SBD and a PiN diode are combined.

Embodiment 2

Figure 7:
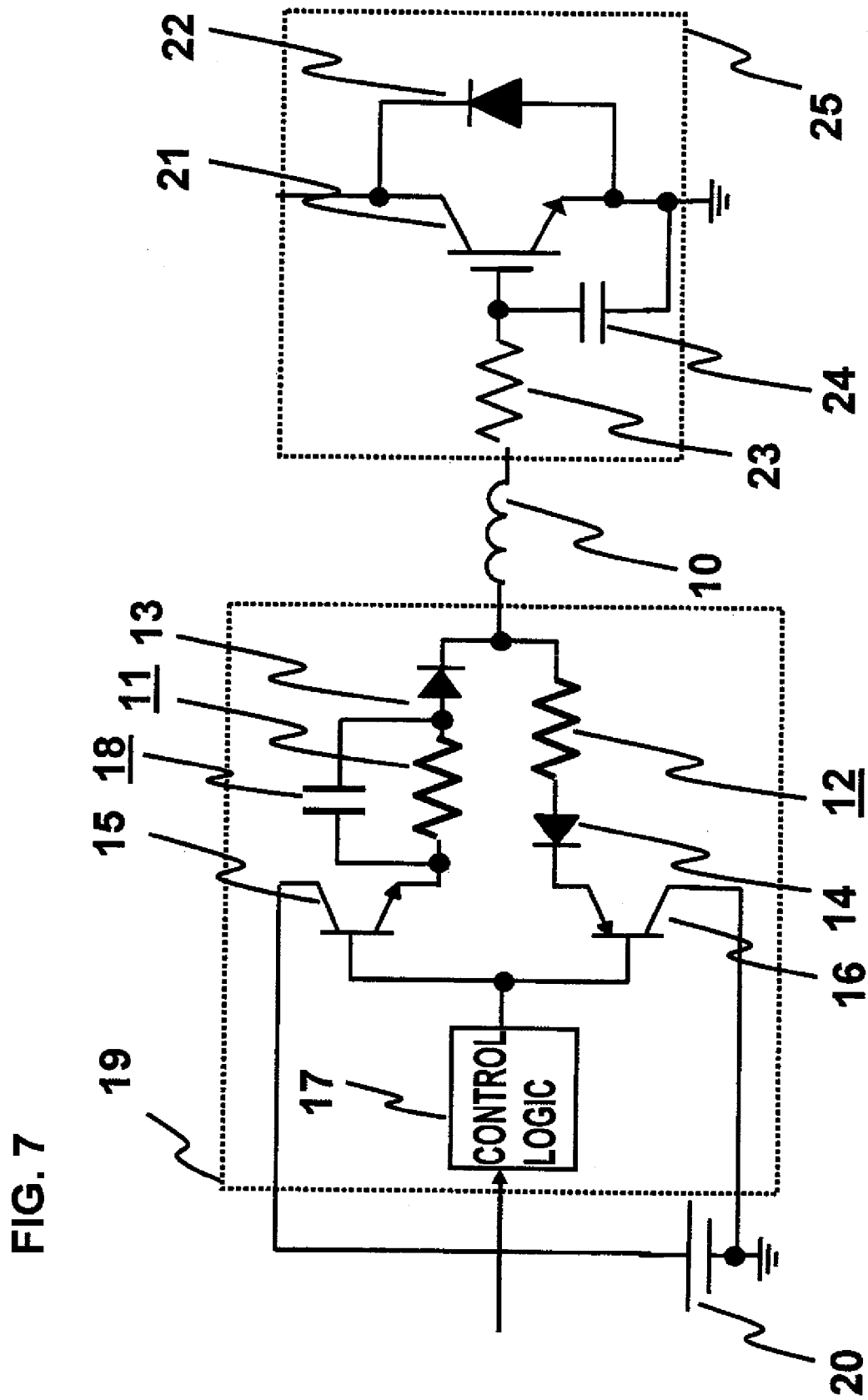
FIG. 7 is a block diagram of a drive circuit of a power semiconductor device according to a second embodiment of the present invention.

FIG. 7 shows a block diagram of a drive circuit of a power semiconductor device according to a second preferred embodiment of the present invention. The same reference numbers are used to denote the same components as embodiment 1. According to the drive circuit of the present invention, in addition to setting the on-side gate resistance 11 smaller than the off-side gate resistance 12, a speed-up capacitor 18 is further provided to be in parallel with the on-gate resistance 11.

Figure 8:
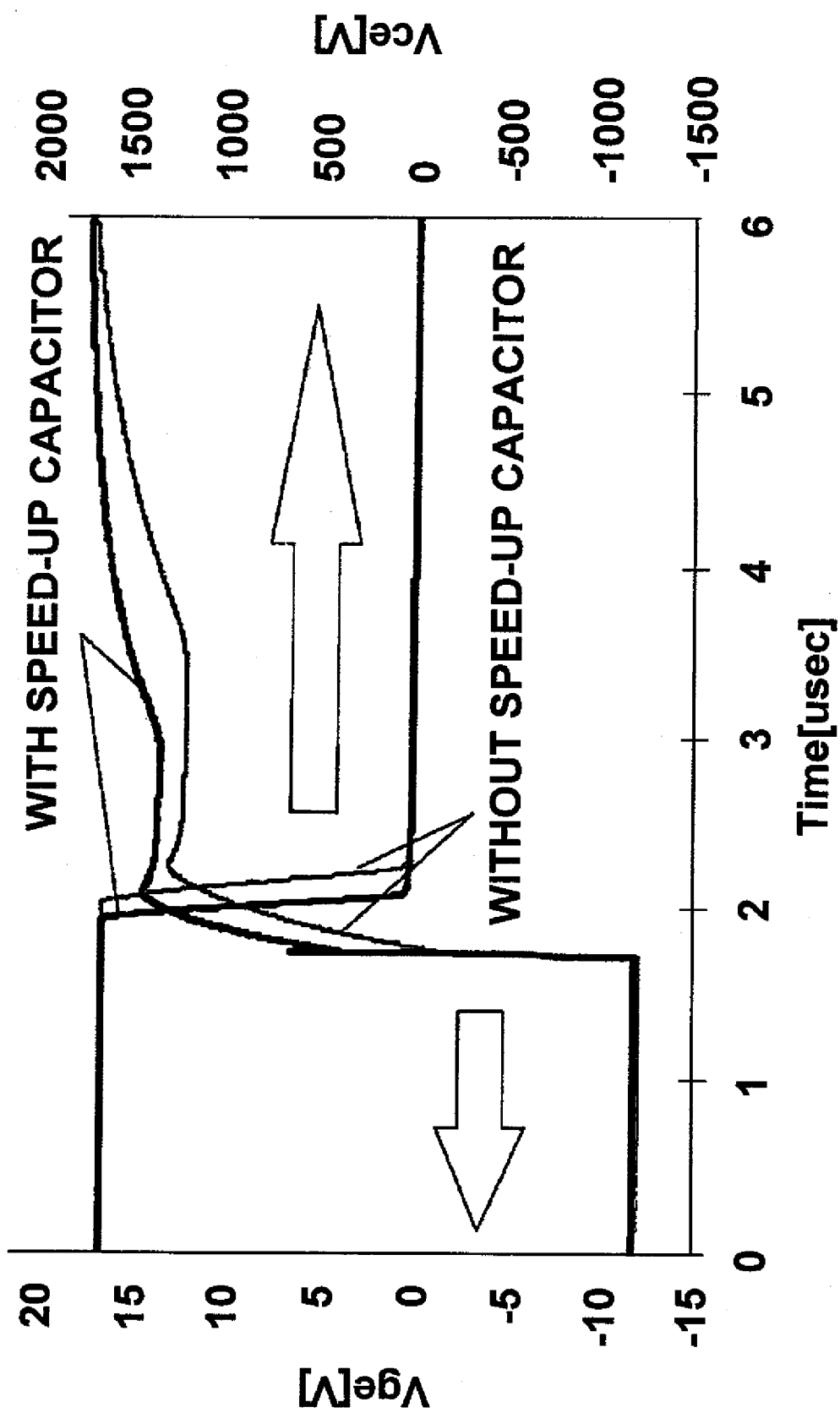
FIG. 8 is a gate drive voltage waveform of a second embodiment according to the present invention.

FIG. 8 shows a gate voltage waveform of a drive circuit according to the second embodiment of the present invention. The gate input capacitance is set to 110 nC, the gate buried resistance is set to 1.0Ω, and the on-side gate resistance is set to 1.0Ω. The turn-on time from the gate voltage rise time is 0.5 μs when the speed-up capacitor 18 is not provided, whereas the turn-on time from the gate voltage rise time can be reduced to approximately half or 0.3 μs by providing the speed-up capacitor 12 μF, according to which high speed drive of IGBT becomes possible.

Embodiment 3

Figure 9:
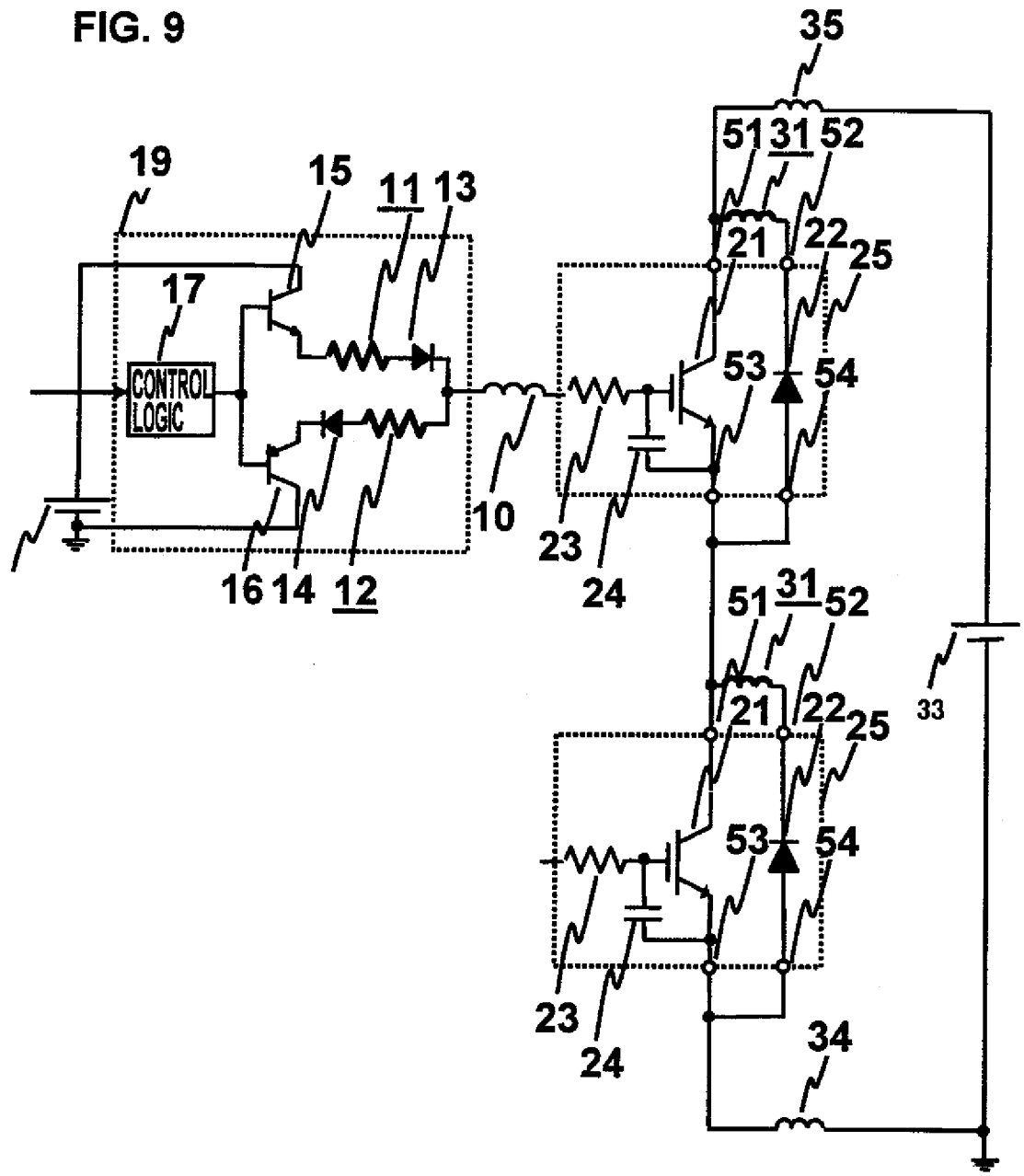
FIG. 9 is a block diagram of an inverter circuit according to the third embodiment of the present invention.

FIG. 9 shows a block diagram of an inverter circuit according to a third preferred embodiment of the present invention. The same components as embodiment 1 are denoted by the same reference numbers. According to the present inverter, power modules 25 are connected in series to constitute a portion corresponding to a single phase of the inverter. The inverter further comprises a main circuit power supply 33 of the inverter, and parasitic inductances 34 and 35 disposed between the power modules 25 and the main circuit power supply 33. According to the power module 25 of the present invention, a high-voltage side terminal 51 of the IGBT and the high-voltage side terminal 52 of the SiC-SBD are provided individually, and an inductance 31 is provided between the high-voltage side terminal 51 of the IGBT and the high-voltage side terminal 52 of the SiC-SBD.

Figure 10:
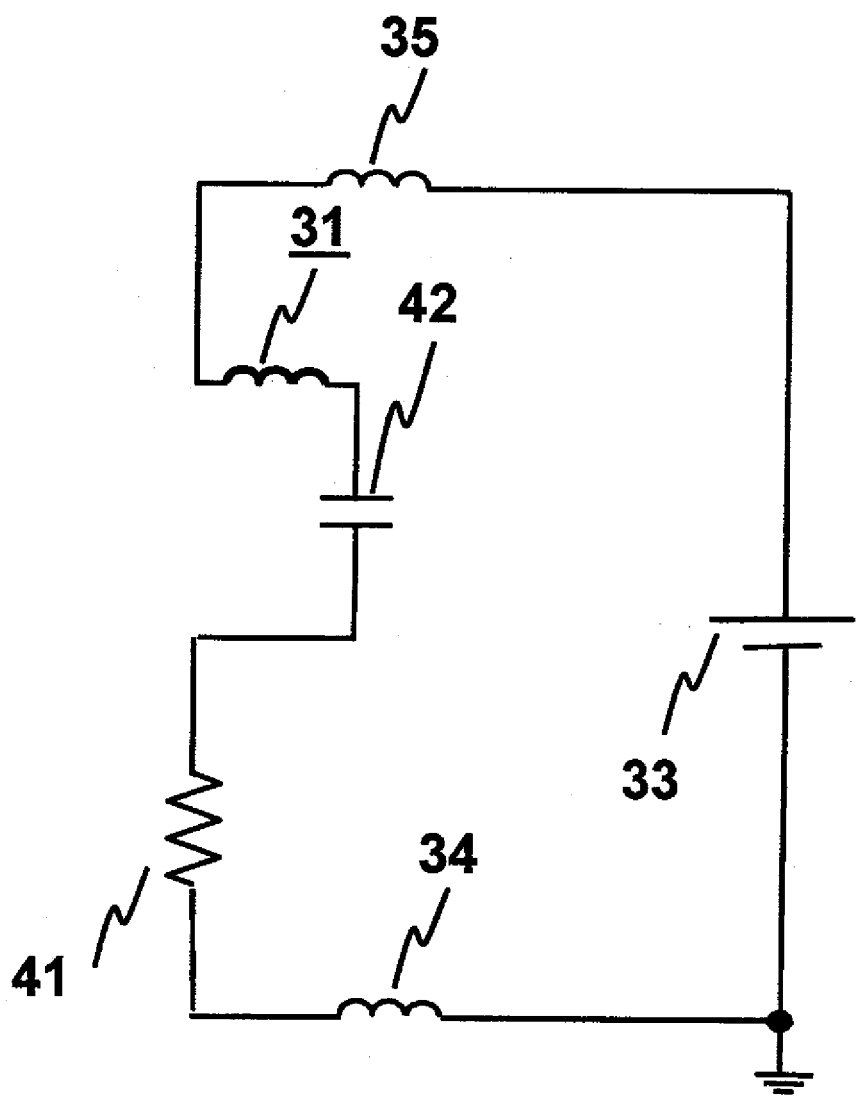
FIG. 10 is an equivalent circuit diagram of a main circuit of an inverter according to the third embodiment of the present invention.

FIG. 10 shows an equivalent circuit diagram of a main circuit of the inverter. A sum of the parasitic inductance 34 and 35 is referred to as $L_s$, an output capacitance 42 of IGBT and SiC-SBD is referred to as $C_{oes}$, and the on resistance 41 of the IGBT is referred to as Ron. Further, an inductance 31 between the high-voltage side terminal 51 of the IGBT and the high-voltage side terminal 52 of the SiC-SBD is referred to as $L_m$.

When $L_m$ is not provided, a frequency band near 9 MHz which is a vibrational frequency specific to SiC-SBD as shown in FIG. 4 was observed. This vibrational frequency is determined by the following expression;

[Expression 4]

$$f_c = \frac{1}{2\pi \cdot \sqrt{L_s \cdot C_{oes}}} \qquad (4)$$

On the other hand, when the inductance 31 is increased, the resonant frequency can be shifted toward the low-frequency side, but the peak of the resonance voltage is increased, and may be diverged. This circuit equation is represented by expression (5);

[Expression 5]

$$(L_s + L_m) \cdot \frac{di}{dt} + (R_{onIGBT}) \cdot i + \frac{1}{C_{oes}} \int i \cdot dt = E \qquad (5)$$

The condition of overdamping for avoiding this oscillation condition is represented by the following expression (6).

[Expression 6]

$$R_{onIGBT} > 2 \cdot \sqrt{\frac{L_s + L_m}{C_{oes}}} \qquad (6)$$

Therefore, by adopting the resonant frequency of expression (4) while satisfying expression (6), it becomes possible to drive the IGBT at high speed and reduce the loss significantly without influencing the noise in the MHz band, by additionally providing the inductance 31.

Figure 11:
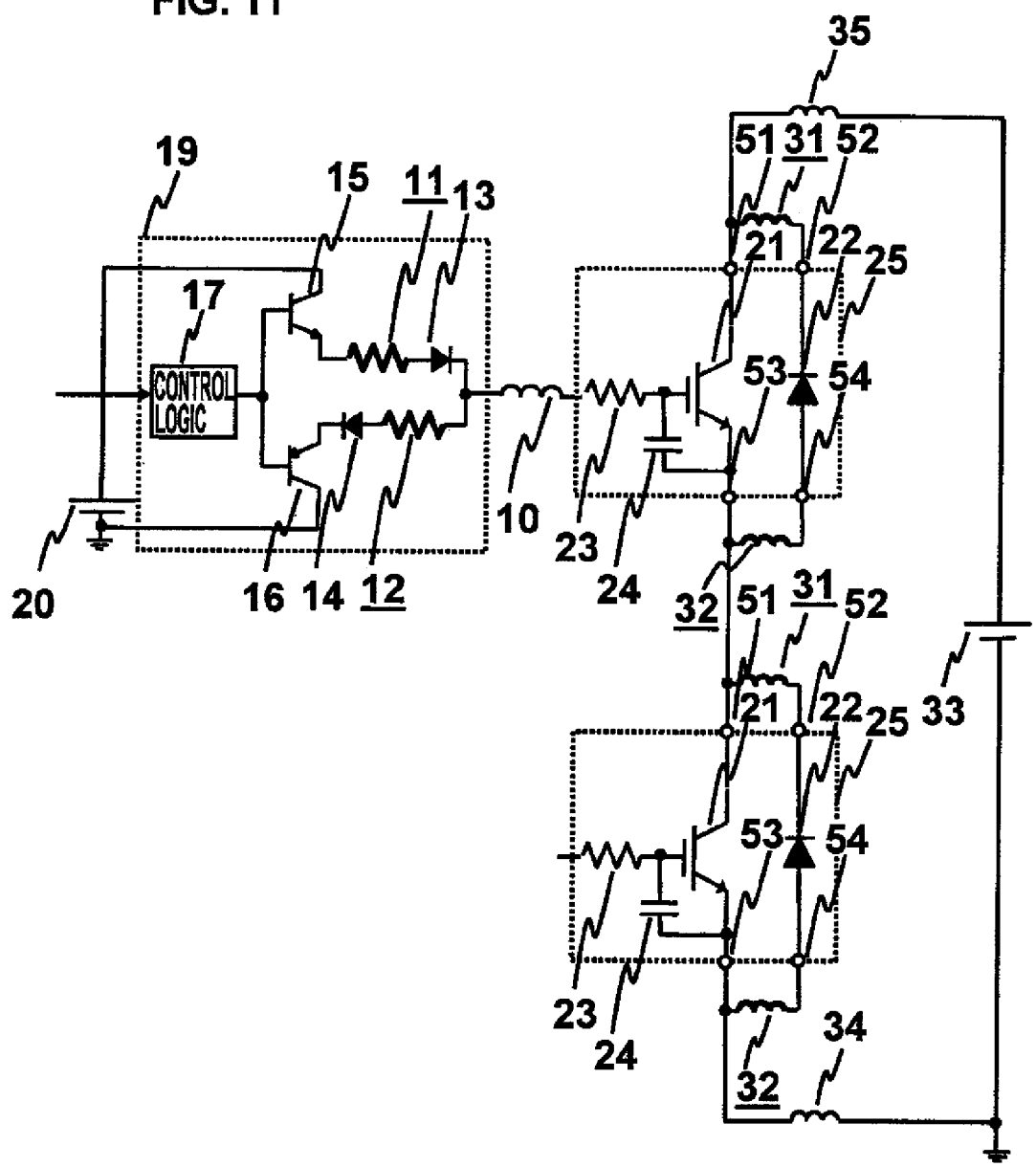
FIG. 11 is a block diagram of an inverter circuit according to the third embodiment of the present invention.

According to FIG. 11, an inductance 32 is provided between the low-voltage side terminal 53 of the IGBT and the low-voltage side terminal 54 of the SiC-SBD, but also in this case, a low-loss and low-noise inverter can be realized by adopting the resonant frequency of expression (4) while satisfying expression (6).

What is claimed is:
1. An inverter device comprising:
  a power semiconductor switching device;
  a freewheeling diode connected in parallel with the power semiconductor switching device, the freewheeling diode comprising a Schottky barrier diode of a wide bandgap semiconductor of SiC, GaN or diamond, a PiN diode, or a MPS diode in which a Schottky barrier diode and a PiN diode are combined; and
  a gate drive circuit of the power semiconductor switching device,
  wherein an on-gate resistance of the power semiconductor switching device is set smaller than an off-gate resistance thereof,
  wherein when a line inductance of the power semiconductor switching device and the gate drive circuit is denoted by $L_g$, a buried resistance of the power semiconductor switching device is denoted by $R_{gin}$, an input capacitance of the power semiconductor switching device is denoted by $C_{ies}$, and an on-gate resistance of the power, semiconductor switching device is denoted by $R_{gon}$, the following condition is satisfied:

$$R_{gon} > 2\sqrt{\frac{L_g}{C_{ies}}} - R_{gin}$$

and wherein a capacitor is provided in parallel with the on-gate resistance of the power semiconductor switching device.
2. An inverter device comprising:
  a power semiconductor switching device;
  a freewheeling diode connected in parallel with the power semiconductor switching device, the freewheeling diode comprising a Schottky barrier diode of a wide bandgap semiconductor of SiC, GaN or diamond, a PiN diode, or a MPS diode in which a Schottky barrier diode and a PiN diode are combined; and a gate drive circuit of the power semiconductor switching device, wherein a first high-voltage side terminal of the power semiconductor switching device and a second high-voltage side terminal of the freewheeling diode are disposed independently, and a first inductance is disposed between the first high-voltage side terminal and the second high-voltage side terminal, and wherein a first low-voltage side terminal of the power semiconductor switching device and a second low-voltage side terminal of the freewheeling diode are disposed independently, and a second inductance is disposed between the first low-voltage side terminal and the second low-voltage side terminal.

3. The inverter device according to claim 2, wherein when a sum of a parasitic inductance is denoted by $L_s$, an output capacitance of the power semiconductor switching device and the freewheeling diode is denoted by $C_{oes}$, an on resistance of the power semiconductor switching device is denoted by $R_{on\ IGBT}$, and an inductance between the high-voltage side terminal of the power semiconductor switching device and the high-voltage side terminal of the freewheeling diode is denoted by $L_m$, $R_{on\ IGBT}$ satisfies the following condition:

$$R_{onIGBT} > 2 \cdot \sqrt{\frac{L_S + L_m}{C_{oes}}}.$$

4. An inverter device comprising:

a power semiconductor switching device;

a freewheeling diode connected in parallel with the power semiconductor switching device, the freewheeling diode comprising a Schottky barrier diode of a wide bandgap semiconductor of SiC, GaN or diamond, a PiN diode, or a MPS diode in which a Schottky barrier diode and a PiN diode are combined; and a gate drive circuit of the power semiconductor switching device, wherein a first high-voltage side terminal of the power semiconductor switching device and a second high-voltage side terminal of the freewheeling diode are disposed independently, and a first inductance is disposed between the first high-voltage side terminal and the second high-voltage side terminal, and wherein when a sum of a parasitic inductance is denoted by $L_s$, an output capacitance of the power semiconductor switching device and the freewheeling diode is denoted by $C_{oes}$, an on resistance of the power semiconductor switching device is denoted by $R_{on\ IGBT}$, and an inductance between the high-voltage side terminal of the power semiconductor switching device and the high-voltage side terminal of the freewheeling diode is denoted by $L_m$, $R_{on\ IGBT}$ satisfies the following condition:

$$R_{onIGBT} > 2 \cdot \sqrt{\frac{L_S + L_m}{C_{oes}}}.$$

* * * * *